United States Patent
Midya et al.

(10) Patent No.: US 7,227,487 B1
(45) Date of Patent: Jun. 5, 2007

(54) DIGITAL SATURATION HANDLING IN INTEGRAL NOISE SHAPING OF PULSE WIDTH MODULATION

(75) Inventors: Pallab Midya, Palatine, IL (US); William J. Roeckner, Carpentersville, IL (US); John Grosspietsch, Libertyville, IL (US); Anthony R. Schooler, Bartlett, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/273,286

(22) Filed: Nov. 14, 2005

(51) Int. Cl.
*H03M 1/82* (2006.01)
(52) U.S. Cl. .................... 341/152; 341/143; 341/155
(58) Field of Classification Search ........... 341/143, 341/155, 152
See application file for complete search history.

(56) References Cited

U.S. PATENT DOCUMENTS

| 6,232,899 | B1 | 5/2001 | Craven |
| 6,414,613 | B1 | 7/2002 | Midya et al. |
| 6,700,518 | B2* | 3/2004 | Kishida .............. 341/143 |
| 6,924,757 | B2* | 8/2005 | Adams et al. ......... 341/143 |
| 7,081,793 | B2* | 7/2006 | Morris et al. ......... 330/10 |

* cited by examiner

*Primary Examiner*—Jean Bruner Jeanglaude
(74) *Attorney, Agent, or Firm*—Brinks Hofer Gilson & Lione

(57) ABSTRACT

An audio amplifier includes a digital signal processor (DSP) that contains a noise shaping quantizer having an integrating error amplifier. The integrating error amplifier contains integrators connected in a feedback loop, a summer supplied with an output of each of the integrators, and a saturation function module producing a saturation function. A multiplier is disposed between each pair of adjacent integrators. The multiplier receives a signal from one of the adjacent integrators and the saturation function and supplies a signal to the other of the adjacent integrators. The saturation function decreases the effect of all of the integrators except an integrator to which an input signal to the integrating amplifier is supplied using an input signal to and/or an output signal from the noise shaping quantizer. This permits the duty ratio of the output signal from the noise shaping quantizer to extend from 0% to 100%.

25 Claims, 5 Drawing Sheets

* POLE PLACEMENT UNDER NORMAL OPERATION
* POLE PLACEMENT UNDER COMPLETE SATURATION
* POLE PLACEMENT DURING TRANSITION though the output signal to the power stage may vary. The quantizer would attempt to "correct" by sending increasingly large outputs, potentially causing oscillation or instability.

DIGITAL SATURATION HANDLING IN INTEGRAL NOISE SHAPING OF PULSE WIDTH MODULATION

TECHNICAL FIELD

The present application relates to noise shaping of a pulse width modulated signal. More specifically, the present application relates to saturation handling of a pulse width modulated signal.

BACKGROUND

Switching amplifiers are used in various electronic components such as audio amplifiers. A switching amplifier consists of a network of switching elements that produces a square wave output and is connected to a load through a power stage. The switching amplifier typically uses pulse width modulation (PWM). The MOSFETs are switched either on or off, rather than operated in linear mode, to convert an input signal to a sequence of pulses (a PWM signal) whose averaged value is directly proportional to the amplitude of the input signal at that time. The frequency of the pulses is typically ten or more times the highest frequency of interest of the input signal. The switching amplifier is used in audio equipment, for example, when reproducing analog signals stored on a compact disc in a digital format.

The PWM switching period is typically fixed. The ratio of the time that a PWM signal is high to the switching period is called the duty ratio. A digital PWM signal is defined by the switching period and the duty ratios. During digital processing, the PWM duty ratio is quantized, resulting in a signal-to-noise ratio that is reduced from that of the original signal. The quantized PWM signal introduces audible distortion and raises the noise level of the audible frequency band. Accordingly, noise shaping is used on the PWM signal to manipulate the signal to reduce the noise level and force the noise out of the audible range. Noise shaping uses a noise shaping loop within the digital processor.

In audio equipment using the switching amplifier, at peaks of audio and high volume settings, the desired output voltage exceeds the capability of the power supply and the power stage. During these times, the largest output power can be obtained by stopping switching of the MOSFETs and allowing the entire power supply across the load. However, large input signals can cause the noise shaping loop to become unstable.

One approach to increase the stability is to artificially limit the amplitude of the input signal to a lower value, and thus the duty ratio of the PWM signal, before the noise shaping loop goes unstable. However, this reduces the peak power out of the amplifier due to both the reduction in duty ratio range and the relative inefficiency of the power stage when operated with a very high or low duty ratio. Additionally, artifacts in the audio signal may be introduced by the transition from the switching mode to the saturation mode (and back) of the switching amplifier. Further, if a lookup table is used to provide the amplitude limitation, a large amount of memory (which is relatively expensive) is used, and the power consumption and size of the device is increased.

BRIEF DESCRIPTION OF THE DRAWINGS

The present invention is illustrated by way of example and not limited to the accompanying figures in which like references indicate similar elements.

Skilled artisans appreciate that elements in the figures are illustrated for simplicity and clarity and have not necessarily been drawn to scale.

DETAILED DESCRIPTION

A switching amplifier is presented that does not artificially limit the duty ratio of the output signal. The switching amplifier contains a digital signal processor (DSP) that includes an integrating error amplifier with a noise shaping quantizer using a saturation function. The saturation function allows the noise shaping quantizer to use the same algorithm independent of whether the noise shaping quantizer is in normal switching mode or in saturation mode. That is, the saturation function allows the noise shaping quantizer to use the same algorithm independent of whether the input signal drives the amplifier into saturation. The switching amplifier can be applied to audio equipment, for example. The computation engine of the DSP is a single instruction, multiple data engine with no branching in the noise shaping loop. This method of saturation handling maintains a continuous loop as one or more channels of the amplifier (if the amplifier has multiple channels) may go in and out of saturation.

Figure 1:
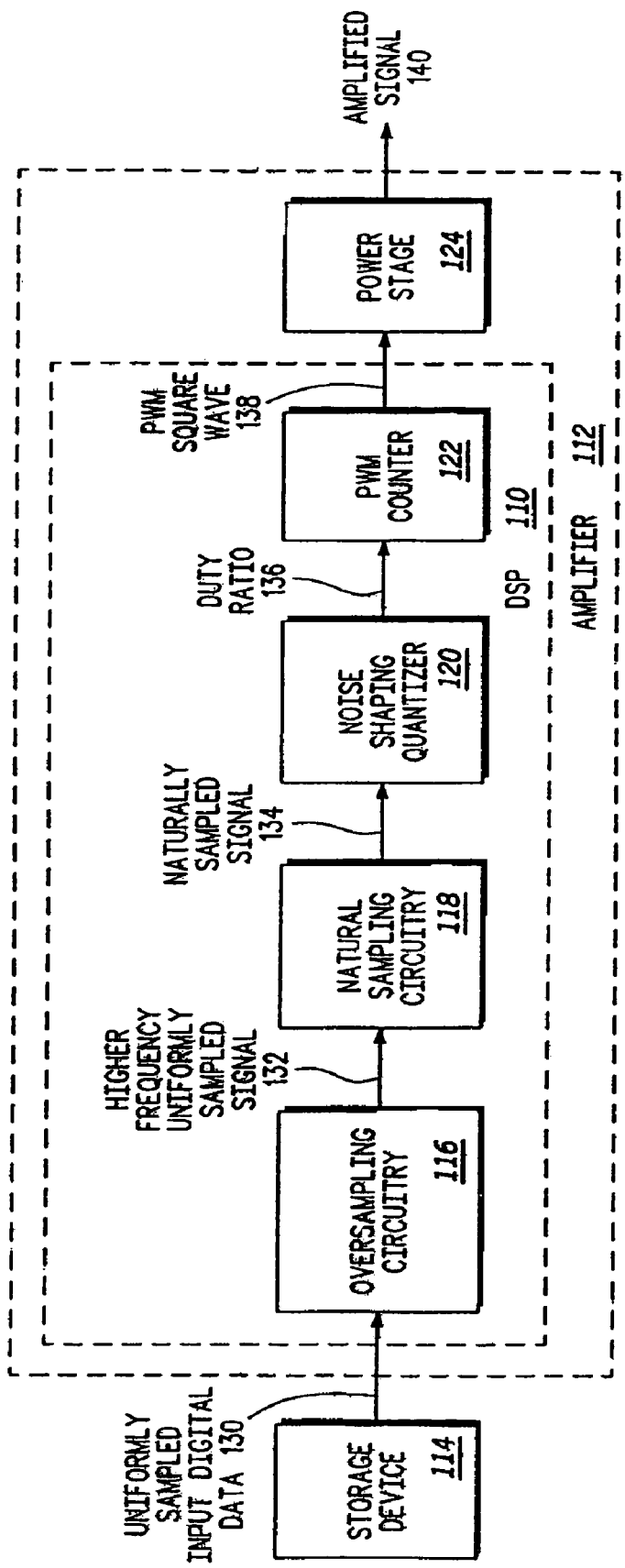
FIG. 1 illustrates an amplifier according to one embodiment.

FIG. 1 illustrates one embodiment of a switching amplifier. Switching amplifier 112 contains digital signal processor 110 and power stage 124. Digital signal processor (DSP) 110 includes oversampling circuitry 116, natural sampling circuitry 118, noise shaping quantizer 120, and pulse-width modulation (PWM) counter 122. Other electronic components known in the art may be present, but are not shown for clarity.

Storage device 114 provides uniformly sampled input digital data 130 to oversampling circuitry 116. Oversampling circuit 116 provides higher frequency uniformly sampled digital data 132, to natural sampling circuitry 118. Natural sampling circuitry 118 provides naturally sampled digital data 134, to noise shaping quantizer 120, which in turn provides a duty ratio 136 to PWM counter 122. PWM counter 122 provides a PWM square wave 138 to power stage 124, which in turn outputs amplified signal 140.

In operation, storage device 114 contains input digital data 130 that is uniformly sampled. Storage device 114 can include such devices as a solid-state memory such as a memory card or other package that houses one or more non-volatile read-only memories, a random access memory or other volatile re-writable memory, or a magneto-optical or optical medium. For example, storage device 114 can include a CD or digital audio tape. Storage device 114 may also be used to broadcast digital data to a receiver for inputting into DSP 110. This broadcast can be over any wireless communication protocol such as Bluetooth.

The uniformly sampled input digital data 130 includes a stream of values which may include an audio signal. For example, CD data has a 16-bit resolution signal sampled at a 44.1 kilohertz frequency. The uniformly sampled input digital data 130 is then converted to a higher frequency uniformly sampled digital data 132 by oversampling circuitry 116. Effectively, oversampling circuitry 116 is a data rate converter in which data is provided at one rate and is output at a different rate. In one embodiment, oversampling circuitry 116 receives uniformly sampled input digital data 130 and samples it at a rate 16 times greater to produce the higher frequency uniformly sampled digital data 132. For example, in the case of the CD where uniformly sampled input digital data 130 is sampled at a rate of 44.1 kilohertz, oversampling circuitry 116 would sample this signal at a higher frequency of 705.6 kilohertz to produce the higher frequency uniformly sampled digital data 132. Natural sampling circuitry 118 then converts the uniformly sampled digital data signal 132 into a naturally sampled digital data signal 134.

Noise shaping quantizer 120, quantizes and noise shapes the naturally sampled digital data signal 134 to produce a lower resolution signal such that the noise in the frequency band of interest is limited. Noise shaping quantizer 120 converts naturally sampled digital data 134 into duty ratio 136. Duty ratio 136 is then used by PWM counter 122 to produce PWM square wave 138. The PWM square wave 138 at the output of PWM counter 122 is amplified by power stage 124 to produce amplified signal 140 at the output of switching amplifier 112. When the duty ratio is larger than 50%, the signal supplied from switching amplifier 112 is positive and has an increasing amplitude. When the duty ratio is smaller than 50%, the signal supplied from switching amplifier 112 is positive and has a decreasing amplitude. Note that although the use of uniformly sampled input digital data is provided in FIG. 1, other embodiments may use digital signals that are not uniformly sampled. For example, the frequency may vary over the range of the input digital data.

The circuitry and programming of oversampling circuitry 116, natural sampling circuitry 118, and pulse-width modulation (PWM) counter 122 are known to those skilled in the art. Thus, circuit details will not be explained in any greater extent than that considered necessary for the understanding and appreciation of the underlying concepts and in order not to obfuscate or distract from the teachings of the present invention.

Figure 2:
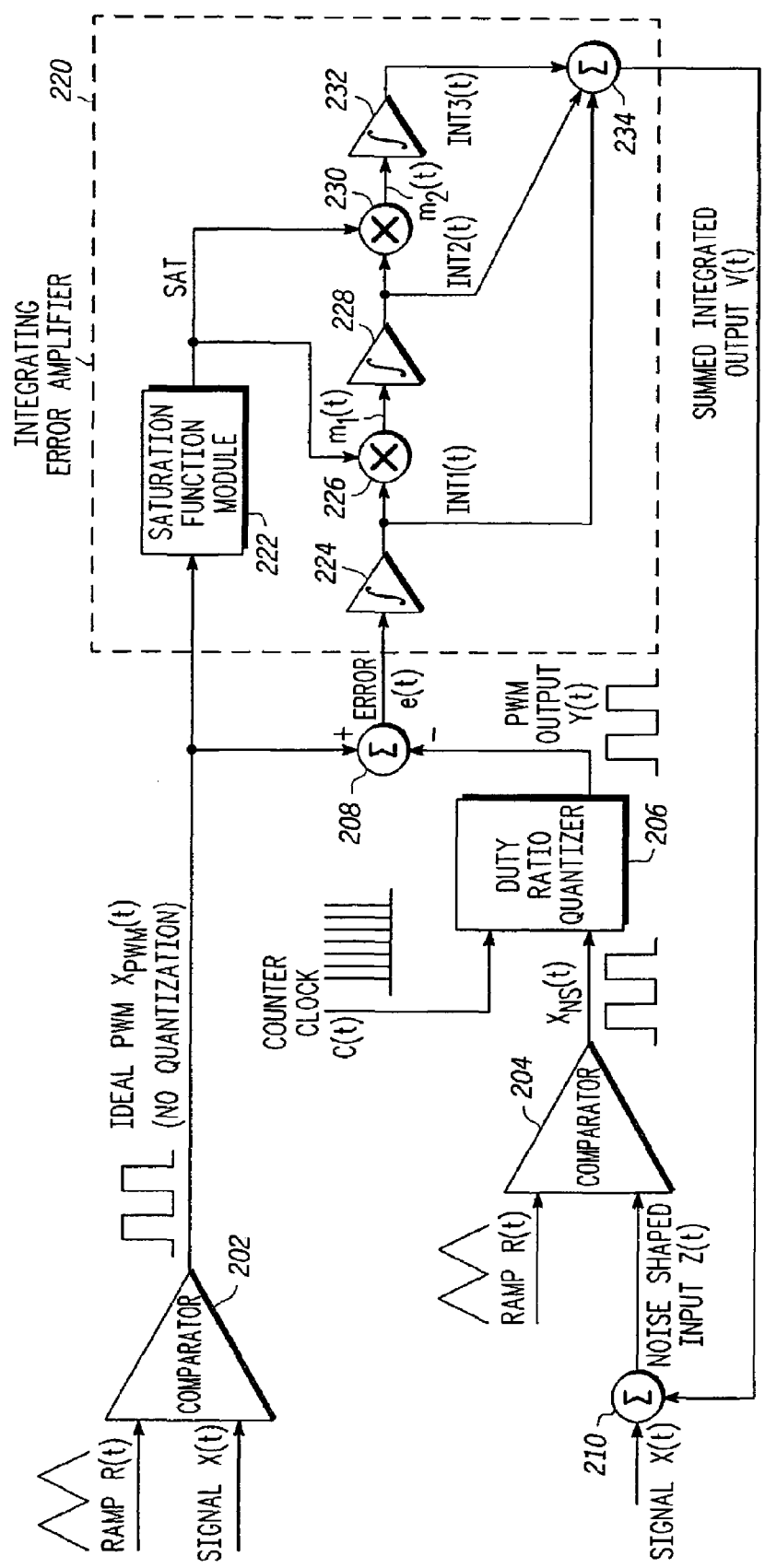
FIG. 2 illustrates a noise shaping quantizer according to one embodiment.

FIG. 2 illustrates one embodiment of noise shaping quantizer 200 in the DSP 110 shown in FIG. 1. Noise shaping quantizer 200 includes first and second comparators 202, 204, first and second summers 208, 210, duty ratio quantizer 206, and integrating error amplifier 220. Integrating error amplifier 220 contains saturation function module 222, first, second, and third integrators 224, 228, 232, first and second multipliers 226, 230, and third summer 234.

Ramp r(t) and input signal x(t) are supplied to the inputs of first comparator 202. Ramp r(t) provides double-sided sampling of the input signal x(t). First comparator 202 compares ramp signal r(t) to input signal x(t). Ramp r(t) is a periodic sawtooth signal that repeats at half the desired sampling frequency. As above, the sampling frequency is 10–20 times higher than the Nyquist rate. The Nyquist rate is about twice the highest frequency of interest. Thus, for audio signals the highest frequency of interest is about 20 KHz and the Nyquist rate is about 40 kilosamples/second. In this case, the sampling frequency is about 600–800 kHz. By comparing the ramp signal r(t) to the input signal x(t), a signal is provided whose width is proportional to the amplitude of the input signal x(t). The output from first comparator 202 is the ideal PWM signal $x_{PWM}(t)$, which does not have quantization. Ideal PWM signal $x_{PWM}(t)$ is supplied to first summer 208 and to saturation function module 222 in integrating error amplifier 220.

Input signal x(t) is also supplied to the input of second summer 210, along with summed integrated output v(t) from third summer 234 in integrating error amplifier 220. The output from second summer 210, noise shaped input signal z(t), and ramp r(t) are supplied to the inputs of second comparator 204. Second comparator 204 compares ramp signal r(t) to noise shaped input signal z(t) and provides noise shaped PWM signal $x_{NS}(t)$.

Noise shaped PWM signal $x_{NS}(t)$ and counter clock c(t) are supplied to the inputs of duty ratio quantizer 206. Counter clock c(t) has a frequency that is much larger than the maximum frequency of interest of input signal x(t). For audio signals, as auditory range for the human ear extends nominally to 20 kHz, the frequency of counter clock c(t) is about 96 kHz. The output of duty ratio quantizer 206 is supplied to first summer 208 and is also taken as the PWM output signal y(t) from noise shaping quantizer 200.

Saturation function module 222 supplies saturation function SAT to first and second multipliers 226, 230. First summer 208 subtracts output signal y(t) from ideal PWM signal $x_{PWM}(t)$ and supplies error signal e(t) to first integrator 224 of integrating error amplifier 220. First integrator 224 integrates the error signal e(t) to produce first integrator output signal $int_1(t)$.

First integrator output signal $int_1(t)$ is supplied both to first multiplier 226 and to third summer 234. First multiplier 226 combines the first integrator output signal $int_1(t)$ with saturation function SAT from saturation function module 222 to produce first multiplier output signal $m_1(t)$. First multiplier output signal $m_1(t)$ is supplied to second integrator 228. Second integrator 228 integrates first multiplier output signal $m_1(t)$ to produce second integrator output signal $int_2(t)$.

Second integrator output signal $int_2(t)$ is supplied both to second multiplier 230 and to third summer 234. Second multiplier 230 combines second integrator output signal $int_2(t)$ with saturation function SAT from saturation function module 222 to produce second multiplier output signal $m_2(t)$. Second multiplier output signal $m_2(t)$ is supplied to third integrator 232. Third integrator 232 integrates second multiplier output signal $m_2(t)$ to produce third integrator output signal $int_3(t)$, which is supplied to third summer 234. As above, third summer 234 provides the feedback to second summer 210 that provides noise shaping of the input signal x(t).

Saturation Function module 222 modifies the gain of the feedback loop inside noise shaping quantizer 120. Saturation function SAT may be either a linear or non-linear function. The linear or non-linear function SAT can either be a continuous linear or non-linear function or piecewise linear or non-linear function. In addition, although saturation function module 222 is shown in FIG. 2 as dependent on only the input signal, any combination of the input signal x(t) and/or output signal y(t) may be used. The modifications are such that the loop transitions from a higher order feedback loop with multiple integrators 224, 228, 232, which is not unconditionally stable, to a first order unconditionally stable loop.

Figure 3:
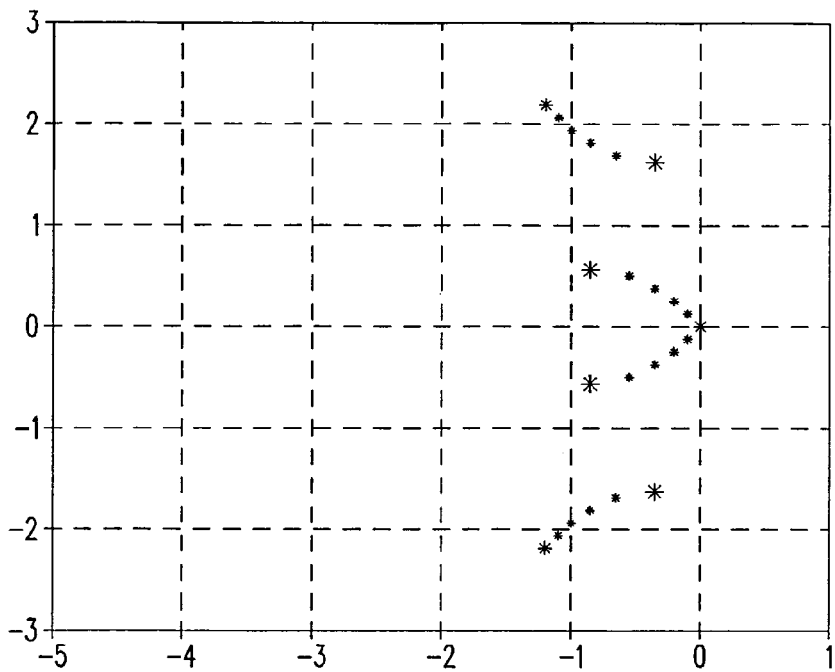
FIG. 3 is an S-domain graph of the poles of a gain function of the noise shaping quantizer according to one embodiment as the system moves into saturation.

This is shown in the example of FIG. 3, which illustrates how the root locus (or poles) of the gain function move with the onset of saturation.

As shown in FIG. 3, before any saturation, the system has four poles (one due to each of the three integrators and one due to the feedback loop). The location of the poles indicates stability of the system; poles that are in the left half plane (to the left of the y axis) and have a relatively small angle with respect to the x axis result in a stable system. At full saturation, the poles caused by second and third integrators 228, 232 become degenerate and have no effect. Referring to FIG. 2, this is to say that saturation function SAT becomes zero, and thus the input to second and third integrators 228, 232 become zero. This, in turn, leads to the output of second and third integrators 228, 232 becoming constant, i.e. second and third integrators 228, 232 are effectively removed from the feedback loop. The constant value is the last value provided by second and third integrators 228, 232. As can be seen in FIG. 3, since the angle from the x-axis in the plot of the existing poles at saturation is not greater than when no saturation is present, and the system is stable when no saturation is present, the system is also stable at saturation.

Figure 4:
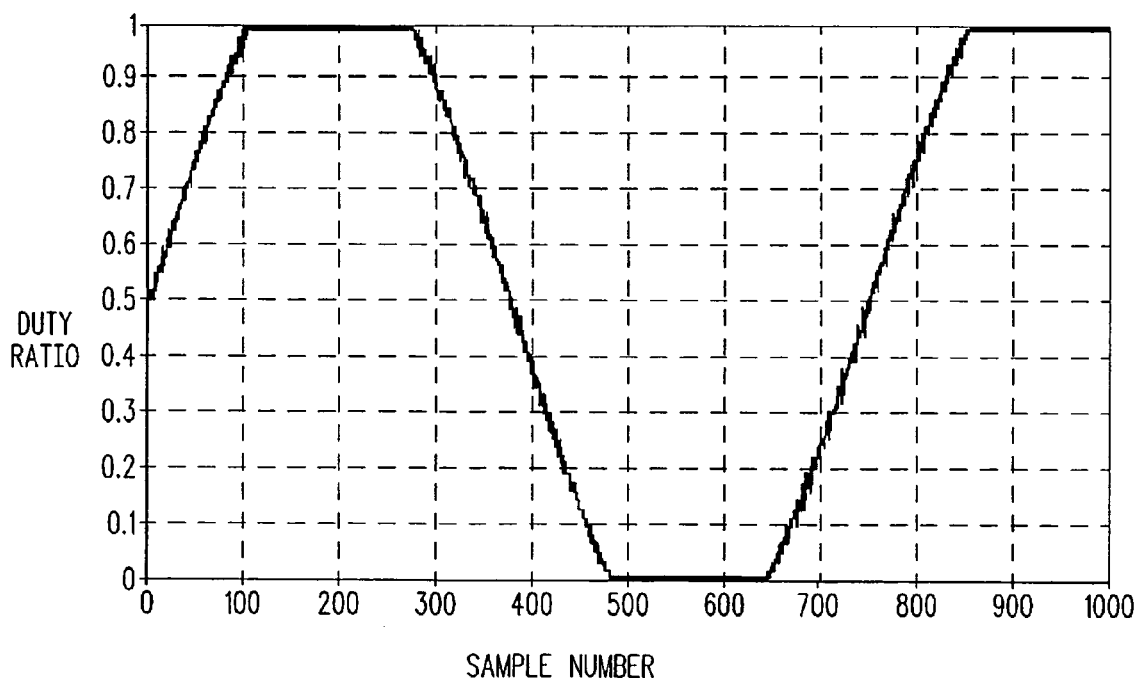
FIG. 4 is a graph of a quantized duty ratio when the input has an amplitude sufficient to drive the system into saturation according to one embodiment.

FIG. 4 illustrates a quantized duty ratio when the input is a sine wave having an amplitude (about 1.2) that is larger than the switching amplifier can handle (1). Unlike arrangements that artificially cap the duty ratio at less than 100% or greater than 0% (for example 10% and 90%), the duty ratio extends to 0% and 100%. That is, as the input signal x(t) saturates the system, the pulse width becomes either high or low for the entire time period of the PWM pulse. As illustrated in FIG. 4, one of the regions in which this occurs is at about sample number 100 to about sample number 275. In an example in which a battery is used as the power supply for an audio system, at a 0% duty ratio, the entire negative battery voltage is provided across the speaker and at a 100% duty ratio, the entire positive battery voltage is provided across the speaker.

Figure 5:
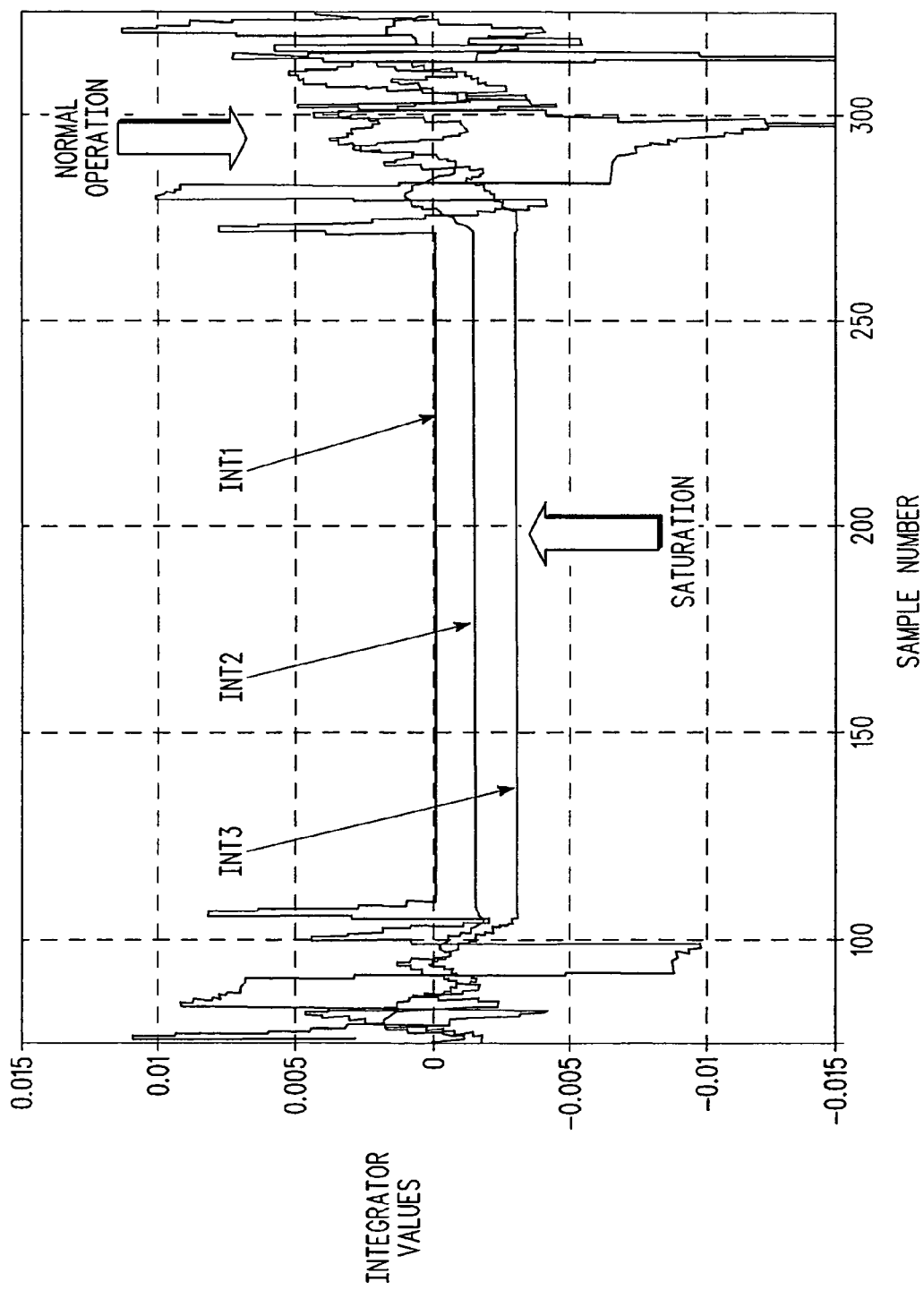
FIG. 5 is a graph showing values from integrators in the noise shaping quantizer during normal operation and saturation according to one embodiment.

Before saturation, the values from the integrators take any value. However, when saturated, the values from the integrators 224, 228, 232 stop changing and maintain the last value before saturation. An example of this is shown in FIG. 5, which shows integrator values corresponding to the sample number between about 75 and 325. As illustrated, the signals from integrators 224, 228, 232 vary in the normal mode but when saturation is reached, the signals stop changing. The operations in the feedback loop are unchanged so that when the level of the input signal crosses the transition point there is no transient or any associated artifact. This is illustrated in FIG. 5, which clearly shows the lack of ringing, overshoot or other transient at transitions between normal operation and saturation.

The equations that define the integral noise shaping without the saturation function are as follows:

$$il_1(n) = I_1(nT_s) = ir_1(n-1) + (1 - yr(n-1)) - (1 - xr(n-1)) \quad [1]$$

$$il_2(n) = \quad [2]$$
$$I_2(nT_s) = ir_2(n-1) + ir_1(n-1) + \frac{(1-yr(n-1))^2 - (1-xr(n-1))^2}{2}$$

$$il_3(n) = I_3(nT_s) = ir_3(n-1) + ir_2(n-1) + \quad [3]$$
$$\frac{ir_1(n-1)}{2} + \frac{(1-yr(n-1))^3 - (1-xr(n-1))^3}{6}$$

$$zl(n) = xl(n) + k_1 il_1(n) + k_2 il_2(n) + k_3 il_3(n) \quad [4]$$

-continued $$ir_1(n) = I_1\left(\left(n + \frac{1}{2}\right)T_s\right) = il_1(n) + ((xl(n)) - (yl(n))) \quad [5]$$

$$ir_2(n) = I_2\left(\left(n + \frac{1}{2}\right)T_s\right) = il_2(n) + il_1(n) + \frac{((xl(n))^2 - (yl(n))^2)}{2} \quad [6]$$

$$ir_3(n) = I_3\left(\left(n + \frac{1}{2}\right)T_s\right) = il_3(n) + il_2(n) + \frac{il_1(n)}{2} + \frac{((xl(n))^3 - (yl(n))^3)}{6} \quad [7]$$

$$zr(n) = xr(n) + k_1 ir_1(n) + k_2 ir_2(n) + k_3 ir_3(n) \quad [8]$$

In eqns. 1–8, n is an integer, Ts is one switching period, $ir_x$ and $il_x$ refer to the output from the integrator number x (i.e. $int_x$) during the falling and rising of the ramp signal r(t), respectively, xl(n) and yl(n) are the input and output duty ratio signals during the rising of the ramp signal r(t), respectively, and xr(n) and yr(n) are the input and output duty ratio signals during the falling of the ramp signal r(t), respectively. Thus, eqns. 1–8 compute the first through third order integrals of the error due to quantization for the right half of the PWM signal y(t). For clarity of presentation, the order of the integrals is from first to third. In practice, the third integral is computed, then the second, and finally the first integral. These integral equations, in closed form, allow the computation to be performed at the sampling frequency. In equation 4, the k values correspond to weighting factors of the integrators. Although the k values shown in FIG. 2 are 1, the k values can take on any value desired. For more information, see U.S. Pat. No. 6,414,613, herein incorporated by reference.

The equations that define the integral noise shaping with the saturation function SAT are as follows:

$$il_1(n) = I_1(nT_s) = ir_1(n-1) + ((1 - yr(n-1)) - (1 - xr(n-1))) \quad [9]$$

$$il_2(n) = I_2(nT_s) = \quad [10]$$
$$ir_2(n-1) + \left(ir_1(n-1) + \frac{(1-yr(n-1))^2 - (1-xr(n-1))^2}{2}\right)SAT$$

$$il_3(n) = I_3(nT_s) = ir_3(n-1) + \quad [11]$$
$$\left(ir_2(n-1) + \frac{ir_1(n-1)}{2} + \frac{(1-yr(n-1))^3 - (1-xr(n-1))^3}{6}\right)SAT$$

$$zr(n) = xr(n) + k_1 ir_1(n) + k_2 ir_2(n) + k_3 ir_3(n) \quad [12]$$

$$ir_1(n) = I_1\left(\left(n + \frac{1}{2}\right)T_s\right) = il_1(n) + ((xl(n)) - (yl(n))) \quad [13]$$

$$ir_2(n) = I_2\left(\left(n + \frac{1}{2}\right)T_s\right) = il_2(n) + \left(il_1(n) + \frac{((xl(n))^2 - (yl(n))^2)}{2}\right)SAT \quad [14]$$

$$ir_3(n) = \quad [15]$$
$$I_3\left(\left(n + \frac{1}{2}\right)T_s\right) = il_3(n) + \left(il_2(n) + \frac{il_1(n)}{2} + \frac{((xl(n))^3 - (yl(n))^3)}{6}\right)SAT$$

$$zr(n) = xr(n) + k_1 ir_1(n) + k_2 ir_2(n) + k_3 ir_3 n) \quad [16]$$

Thus, eqns. 9–16 are similar to eqns. 1–8, except that the input and output signals at half the previous sampling period Ts are multiplied by the saturation function SAT.

Figure 6:
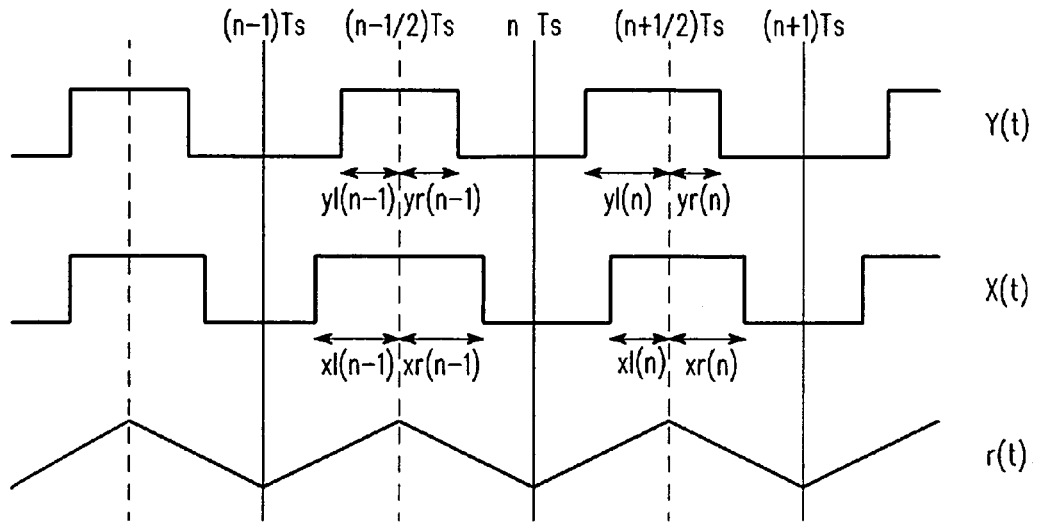
FIG. 6 is a typical timing diagram illustrating the input and output signals as well as the sampling ramp signal.

One example of a typical timing diagram for the input signal x(t), the output signal y(t), and ramp r(t) is shown in FIG. 6. As can be seen, ramp r(t) is periodic and has a period of Ts. If ramp r(t) has a nadir at nTs, where n is an integer, the apex of ramp r(t) occurs at (n−1/2)Ts. Between (n−1)Ts and nTs the input and output signals on the left half of ramp r(t) are labeled xl(n−1) and yl(n−1), respectively, and the input and output signals on the right half of ramp r(t) are labeled xr(n−1) and yr(n−1), respectively. Similarly, between nTs and (n+1)Ts the input and output signals on the left half of ramp r(t) are labeled xl(n) and yl(n), respectively, and the input and output signals on the right half of ramp r(t) are labeled xr(n) and yr(n), respectively. The rise and fall times, and thus the widths of the input and output signals (xl(n−1), xr(n−1), yl(n−1), yr(n−1), xl(n), xr(n), yl(n), and yr(n)) vary dependent on the quantization from the previous period, as described in more detail in U.S. Pat. No. 6,414,613.

The integral noise shaping and saturation function SAT can be described by the following algorithms (where x and y here indicate the duty ratio of the input and output signal, respectively, 0=0% and 1=100%):

$$SAT=0 \text{ for } x=1 \text{ or } x=0 \text{ (input saturation)} \quad [17]$$

$$SAT=1 \text{ for small signals } (x=1/2) \quad [18]$$

$$SAT=0 \text{ for } y=1 \text{ or } y=0 \text{ (output saturation)} \quad [19]$$

These conditions can be filled by different continuous nonlinear equations, for example:

$$SAT=(1-(2x-1)^{2n}) \quad [20]$$

$$SAT=(1-(2y-1)^{2m})(1-(2x-1)^{2n}) \quad [21]$$

$$SAT=4x(1-x) \quad [22]$$

$$SAT=8x(1-x)\{1-2x(1-x)\} \quad [23]$$

$$SAT=1-(2x-1)^{2^n} \quad [24]$$

$$SAT=\{1-(2x-1)^{2n}\}\{1-(2y-1)^{2m}\} \quad [25]$$

Alternately, different nonlinear piecewise equations can be used. For example:

$$SAT=8(x-2x^2) \text{ for } 0 \leq x < 1/4,$$

$$SAT=1 \text{ for } 1/4 \leq x < 3/4,$$

$$SAT=8(3x-2x^2-1) \text{ for } 3/4 < x \leq 1, \quad [26]$$

$$SAT=16(x-4x^2) \text{ for } 0 \leq x < 1/8,$$

$$SAT=1 \text{ for } 1/8 \leq x \leq 7/8,$$

$$SAT=16(7x-4x^2-3) \text{ for } 7/8 < x \leq 1, \quad [27]$$

$$SAT=32(x-8x^2) \text{ for } 0 \leq x < 1/16,$$

$$SAT=1 \text{ for } 1/16 \leq x \leq 15/16,$$

$$SAT=32(15x-8x^2-7) \text{ for } 15/16 < x \leq 1, \quad [28]$$

Continuous linear and piecewise linear equations can also be used as saturation function SAT.

Depending on the algorithm used, there is little or no branching for the integral noise shaping. As shown in FIG. 2, integrating error amplifier 220 has a small module that supplies the saturation algorithm (saturation function module 222), which may have branching for piecewise linear saturation functions. However, the feedback loop in the integral noise shaping is performed (i.e. eqns. 9–16) are calculated with no branching—it performs the same functions, merely using the saturation function as a multiplicand. As there is no branching in the feedback loop, this increases the efficiency of the processor, thereby saving energy.

Turning to power consumption efficiency, the MOSFETs (not shown) in power stage 124 dissipate very little power except during the interval between their on and off states. The power wasted is low because the instantaneous power dissipated in the MOSFETs is the product of voltage and current, and one or the other is almost always close to zero. The saturation function increases the peak power out of switching amplifier 112 as power stage 124 is relatively more efficient when operated with a 0% or 100% duty ratio than when operated at a duty ratio close to 0% or 100%.

Figure 7:
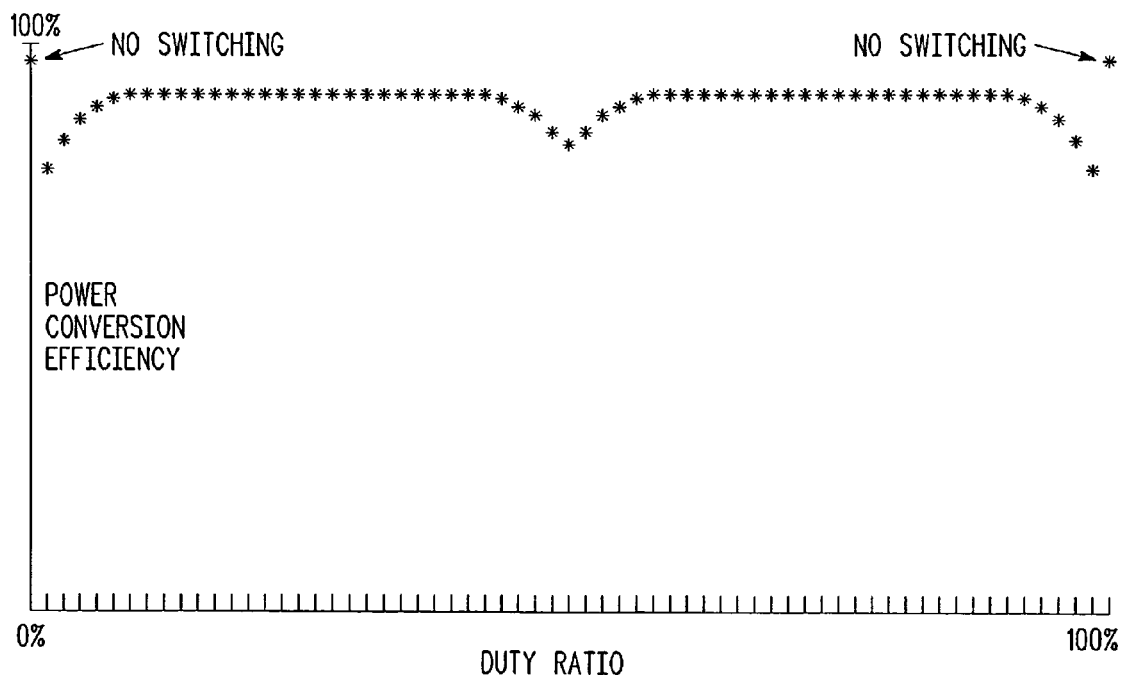
FIG. 7 is a typical curve of efficiency vs. duty ratio for a switching amplifier.

One cause of the inefficiency in the power stage 124 when operating at a duty ratio close to 0% or 100%, however, is due to the MOSFETs in the power stage being forced to transition fast enough so that they are not able to reach steady state equilibrium. A typical curve of efficiency vs. duty ratio is shown in FIG. 7. As illustrated, the power conversion efficiency remains substantially flat over a wide range of duty ratios, dropping rapidly at about 10% and 90% until the duty ratio reaches 0% or 100%. When the duty ratio reaches 0% or 100%, however, the efficiency increases as no switching of the MOSFETs occur.

Thus, the switching amplifier described can provide a PWM signal with a duty ratio that extends between any arbitrary pair of values, for example, as indicated from 0% to 100%. In different embodiments, this may result in a peak power rating of the switching amplifier being 30 to 40% greater (i.e. a higher output power) compared to that of a switching amplifier whose duty ratio is limited to about 10%–90% in order to maintain loop stability. A higher power switching amplifier is not only louder but is often perceived to be a higher audio quality than a lower power switching amplifier. This may be desirable when the power supply of the switching amplifier is a battery, as the battery voltage is not changeable by design. Examples of using a battery voltage include portable applications or automotive applications. In such examples, it is impractical to use large, expensive, and/or high power consuming components such as a boost power converter to increase the power and limit the duty ratio between 10% and 90% of the nominal duty ratio.

Note that although an embodiment with three integrators is shown, the number of integrators can vary, and can be two, four, five, or more, depending on how much performance or computation vs. power consumed is desired. Similarly, only a single saturation function can be used or a number of saturation functions can be selectable as desired. For example, for automotive audio switching amplifiers or stereo equipment that is plugged into a wall socket, in which a substantial amount of power is available, a more aggressive algorithm may be desired, whereas for a portable device such as an MP3 player with a small amount of power is available, a lower performance may be more desirable.

While the present disclosure has primarily described applications such as digital audio amplification applications, it is also applicable to other power applications, including motor control, data conversion, power amplification, and radio frequency (RF) synthesizers with or without amplification. In any system where the output signal is quantized and noise is to be removed from the output, the present invention provides a method of noise shaping in which the quantization error and saturation function is used in coordination with a noise shaping filter to remove the noise from the desired baseband of the output.

In other embodiments, a feed forward arrangement rather than a feedback arrangement may be provided. Although an embodiment using a DSP is provided, in other embodiments software to achieve the same results may be implemented as code stored in any adequate computer readable medium and alternate hardware may be used. For example, a hardware accelerator may be used to implement the noise shaping function. The hardware accelerator may include a custom logic board with processor, and may implement at least a portion of the function in software. The entire operation may also be implemented in an integrated circuit providing an embedded solution.

Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A switching amplifier comprising a noise shaping quantizer, the noise shaping quantizer having an integrating error amplifier, the integrating error amplifier containing a plurality of series connected integrators in a loop and a saturation function module producing a saturation function, the saturation function continually decreasing the effect of at least one of the integrators from the loop when a duty ratio of at least one of an input signal to or an output signal from the noise shaping quantizer varies between predetermined values;
   wherein a frequency of the input signal to and an output signal from the noise shaping quantizer is fixed.

2. The switching amplifier of claim 1, wherein the saturation function is a nonlinear function.

3. The switching amplifier of claim 1, wherein the saturation function is a piecewise function.

4. The switching amplifier of claim 3, wherein the saturation function is a nonlinear function.

5. The switching amplifier of claim 1, wherein the saturation function completely removes the effect of the at least one of the integrators from the loop only when the duty ratio of the at least one of the input or output signal is 0% to 100%.

6. The switching amplifier of claim 5, wherein the saturation function continually reduces the effect of the at least one of the integrators when the duty ratio varies from a first duty ratio to 0% to 100%.

7. The switching amplifier of claim 6, wherein the first duty ratio is 50%.

8. The switching amplifier of claim 6, wherein the saturation function does not change the effect of the at least one of the integrators from the first duty ratio to the second duty ratio.

9. The switching amplifier of claim 6, wherein the saturation function is $(1-(2x-1)^{2n})$, where x is the duty ratio of the input signal (x=0.5 for a 50% duty ratio and x=1 for a 100% duty ratio) and n is an integer.

10. The switching amplifier of claim 1, wherein the noise shaping quantizer is implemented within a digital signal processor (DSP).

11. The switching amplifier of claim 10, further comprising oversampling circuitry, natural sampling circuitry connected between the oversampling circuit and the noise shaping quantizer, and a pulse-width modulation counter supplied with a signal from the noise shaping quantizer.

12. A switching amplifier comprising a noise shaping quantizer, the noise shaping quantizer having an integrating error amplifier, the integrating error amplifier containing a plurality of series connected integrators in a loon and a saturation function module producing a saturation function, the saturation function continually decreasing the effect of at least one of the integrators from the loop when a duty ratio of at least one of an input signal to or an output signal from the noise shaping quantizer varies between predetermined values;
   wherein the integrators are disposed in a feedback loop arrangement and the integrating error amplifier further comprises a multiplier between each pair of integrators; and
   wherein each multiplier supplied with the saturation function and an output from one of the integrators between which the multiplier is disposed, an output of the multiplier supplying the other of the integrators between which the multiplier is disposed.

13. The switching amplifier of claim 12, wherein the noise shaping quantizer further comprises:
   a first comparator to which the input signal of the noise shaping quantizer and a ramp signal are supplied, an output of the first comparator supplied to the saturation function module of the integrating error amplifier,
   a second comparator to which the ramp signal is supplied,
   a duty ratio quantizer to which an output of the second comparator and a clock signal are supplied,
   a first summer subtracting an output of the duty ratio quantizer from the output of the first comparator to produce an error signal that is supplied to a first of the integrators of the integrating error amplifier,
   a second summer in the integrating error amplifier to which outputs from each of the integrators are supplied, and
   a third summer to which an output of the second summer and the input signal of the noise shaping quantizer are supplied, and an output of the third summer is supplied to an input of the second comparator.

14. A digital audio amplifier comprising a digital signal processor (DSP) and a power stage to which an output of the digital signal processor is supplied, the DSP containing a noise shaping quantizer having an integrating error amplifier, the integrating error amplifier containing a plurality of series connected integrators in a feedback loop, a summer supplied with an output of each of the integrators, a saturation function module producing a saturation function, a multiplier disposed between each pair of adjacent integrators to which an output of one of the adjacent integrators and the saturation function are supplied and which supplies an input of the other of the adjacent integrators, the saturation function decreasing the effect of all of the integrators except an integrator to which an input signal to the integrating amplifier is supplied using at least one of an input signal to the integrating amplifier is supplied using at least one of an input signal to or an output signal from the noise shaping quantizer such that a duty ratio of the output signal from the noise shaping quantizer extends from 0% to 100%.

15. The digital audio amplifier of claim 14, wherein the saturation function is a nonlinear function.

16. The digital audio amplifier of claim 14, wherein the saturation function is a piecewise function.

17. The digital audio amplifier of claim 16, wherein the saturation function is a nonlinear function.

18. The digital audio amplifier of claim 14, wherein the saturation function completely removes the effect of the integrators from the loop only when the duty ratio of the at least one of the input or output signal is 0% to 100%.

19. The digital audio amplifier of claim 18, wherein the saturation function is $(1-(2x-1)^{2n})$, where x is the duty ratio of the input signal (x=0.5 for a 50% duty ratio and x=1 for a 100% duty ratio) and n is an integer.

20. A method of noise shaping a pulse width modulated signal, the method comprising:

receiving an input signal;

generating a first pulse width modulated (PMW) signal using the input signal and a second PMW signal using a noise shaped input signal;

quantizing the second PMW signal to produce a quantized signal;

subtracting the quantized signal from the first PWM signal to produce an error signal;

providing a plurality of integrators and multipliers between each integrator that are series connected such that the error signal is integrated to produce an integrated signal and multiplied by a saturation function to provide a multiplied signal that is integrated, the saturation function decreasing as a duty ratio of at least one of the input signal to or an output signal from the noise shaping quantizer extends from 0% to 100%; and summing all of the integrated signals to generate the noise shaped input signal.

21. The method of claim 20, wherein the saturation function is a nonlinear function.

22. The method of claim 20, wherein the saturation function is a piecewise function.

23. The method of claim 22, wherein the saturation function is a nonlinear function.

24. The method of claim 20, wherein the saturation function becomes 0 only when the duty ratio of the at least one of the input or output signal is 0% or 100%.

25. The method of claim 24, wherein the saturation function is $(1-(2x-1)^{2n})$, where x is the duty ratio of the input signal (x=0.5 for a 50% duty ratio and x=1 for a 100% duty ratio) and n is an integer.

* * * * *